United States Patent
Höppel

(10) Patent No.: US 11,088,297 B2
(45) Date of Patent: Aug. 10, 2021

(54) METHOD OF SEPARATING A COMPONENT USING PREDETERMINED BREAKING POSITION AND A COMPONENT OBATINED BY SUCH METHOD

(71) Applicant: OSRAM Opto Semiconductors GmbH, Regensburg (DE)

(72) Inventor: Lutz Höppel, Alteglofsheim (DE)

(73) Assignee: OSRAM OLED GMBH, Regensburg (DE)

( * ) Notice: Subject to any disclaimer, the term of this patent is extended or adjusted under 35 U.S.C. 154(b) by 152 days.

(21) Appl. No.: 16/485,414

(22) PCT Filed: Mar. 20, 2018

(86) PCT No.: PCT/EP2018/057013
§ 371 (c)(1),
(2) Date: Aug. 12, 2019

(87) PCT Pub. No.: WO2018/177810
PCT Pub. Date: Oct. 4, 2018

(65) Prior Publication Data
US 2019/0393376 A1    Dec. 26, 2019

(30) Foreign Application Priority Data

Mar. 29, 2017   (DE) .......................... 102017106730.2

(51) Int. Cl.
*H01L 33/00* (2010.01)
*H01L 31/02* (2006.01)
(Continued)

(52) U.S. Cl.
CPC .... *H01L 33/0095* (2013.01); *H01L 31/02002* (2013.01); *H01L 31/02322* (2013.01);
(Continued)

(58) Field of Classification Search
CPC ........... H01L 33/0095; H01L 31/02002; H01L 31/02322; H01L 31/186; H01L 33/62;
(Continued)

(56) References Cited

U.S. PATENT DOCUMENTS 8,573,469 B2   11/2013   Hu et al.
9,105,714 B2   8/2015    Hu et al.
(Continued)

FOREIGN PATENT DOCUMENTS

DE    10246053 A1    4/2004
WO    2015099944 A1  7/2015
(Continued)

*Primary Examiner* — Allen L Parker
*Assistant Examiner* — Wasiul Haider
(74) *Attorney, Agent, or Firm* — Slater Matsil, LLP

(57) ABSTRACT

A method for producing a component and a component are disclosed. In an embodiment a method includes providing a substrate, applying a composite of components to the substrate, forming an anchoring layer on the composite of components, attaching a carrier to the anchoring layer, wherein the anchoring layer is disposed between the substrate and the carrier and removing the substrate, wherein the composite of components is divided into a plurality of components by forming a plurality of separating trenches, wherein, after removing the substrate, the components continue to be held on the carrier by the anchoring layer, and wherein the anchoring layer comprises at least one predetermined breaking layer having at least one predetermined breaking position, the predetermined breaking position being laterally surrounded by the separating trenches and—in a plan view of the carrier—being covered by one of the components.

20 Claims, 8 Drawing Sheets

(51) Int. Cl.
   *H01L 31/0232*   (2014.01)
   *H01L 31/18*     (2006.01)
   *H01L 33/50*     (2010.01)
   *H01L 33/62*     (2010.01)

(52) U.S. Cl.
   CPC ............ *H01L 31/186* (2013.01); *H01L 33/50* (2013.01); *H01L 33/62* (2013.01)

(58) Field of Classification Search
   CPC ......... H01L 2933/0033; H01L 33/0093; H01L 21/7806
   See application file for complete search history.

(56) References Cited

U.S. PATENT DOCUMENTS

| | | |
|---|---|---|
| 9,209,348 B2 | 12/2015 | Hu et al. |
| 9,217,541 B2 | 12/2015 | Bathurst et al. |
| 9,368,683 B1 | 6/2016 | Meitl et al. |
| 2010/0301431 A1 | 12/2010 | Ding et al. |
| 2015/0371874 A1 | 12/2015 | Bower et al. |
| 2015/0372187 A1 | 12/2015 | Bower et al. |
| 2016/0086855 A1 | 3/2016 | Bower et al. |
| 2016/0225953 A1 | 8/2016 | Meitl et al. |
| 2016/0240516 A1 | 8/2016 | Chang |
| 2016/0254253 A1 | 9/2016 | Meitl et al. |
| 2019/0214302 A1* | 7/2019 | Reber ............... H01L 21/02381 |

FOREIGN PATENT DOCUMENTS

| | | |
|---|---|---|
| WO | 201593436 A1 | 12/2015 |
| WO | 2015193435 A1 | 12/2015 |
| WO | 2016120400 A1 | 8/2016 |

\* cited by examiner

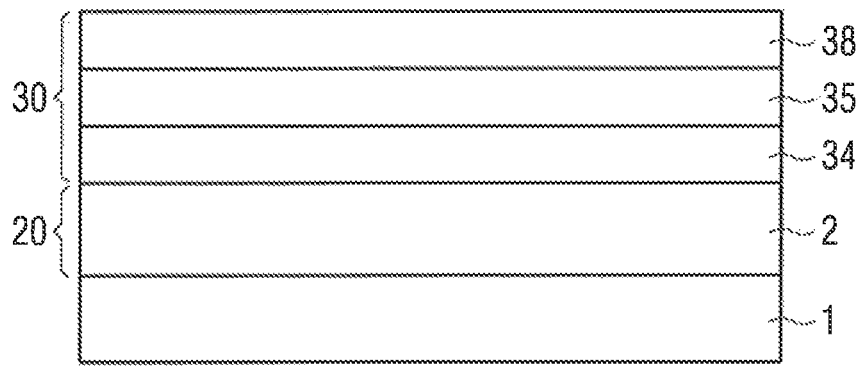
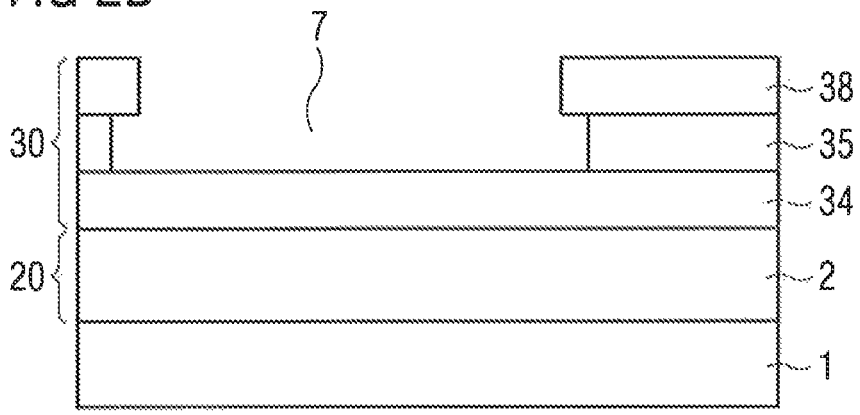
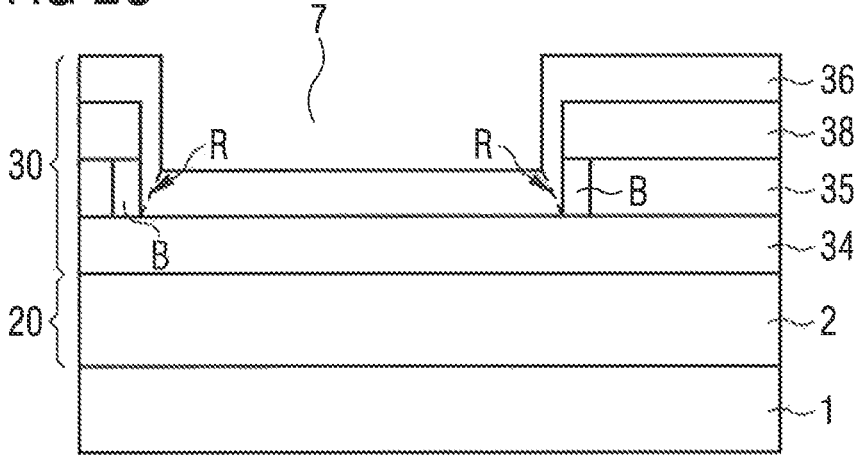

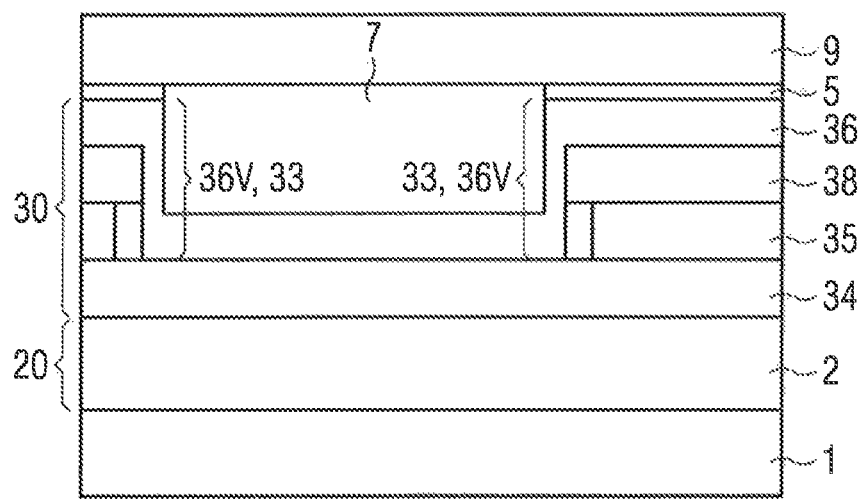
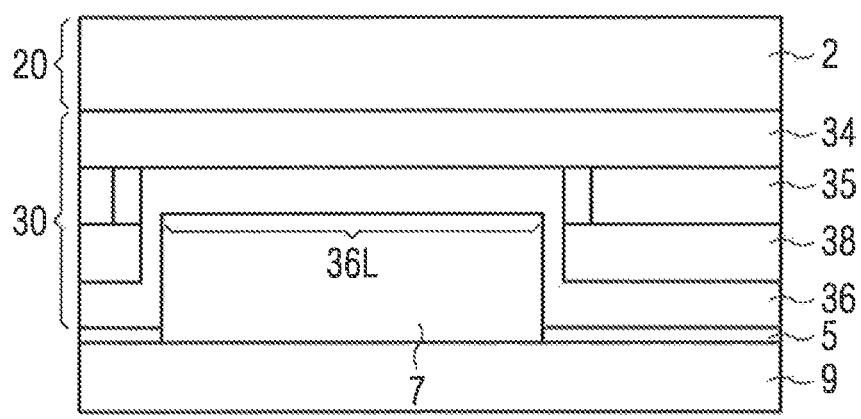
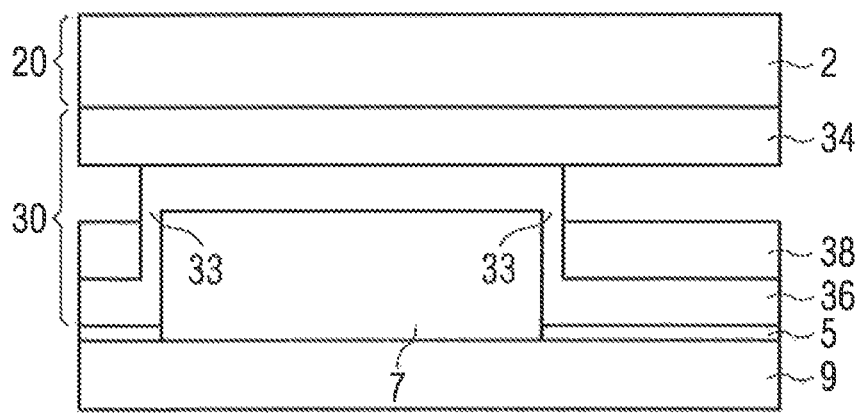

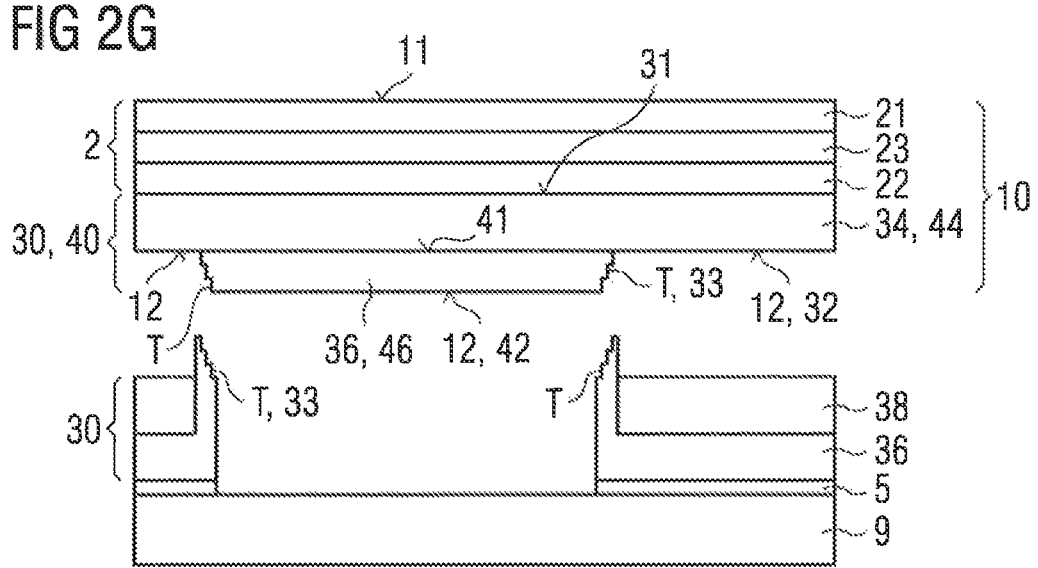
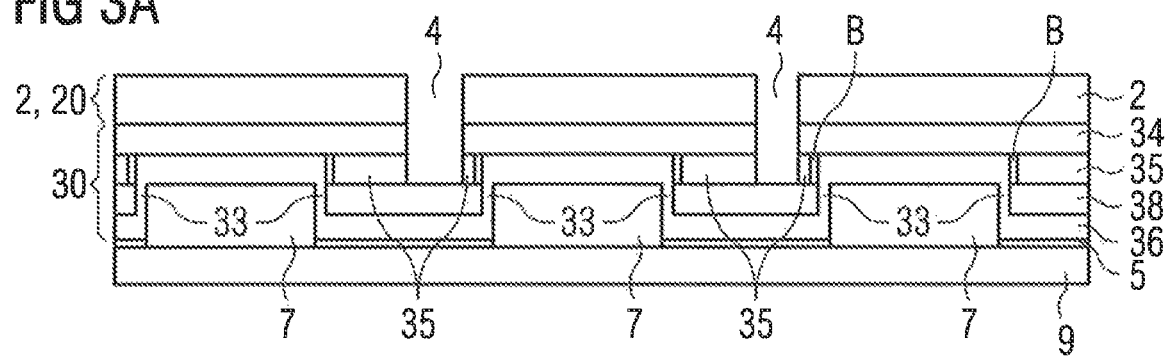
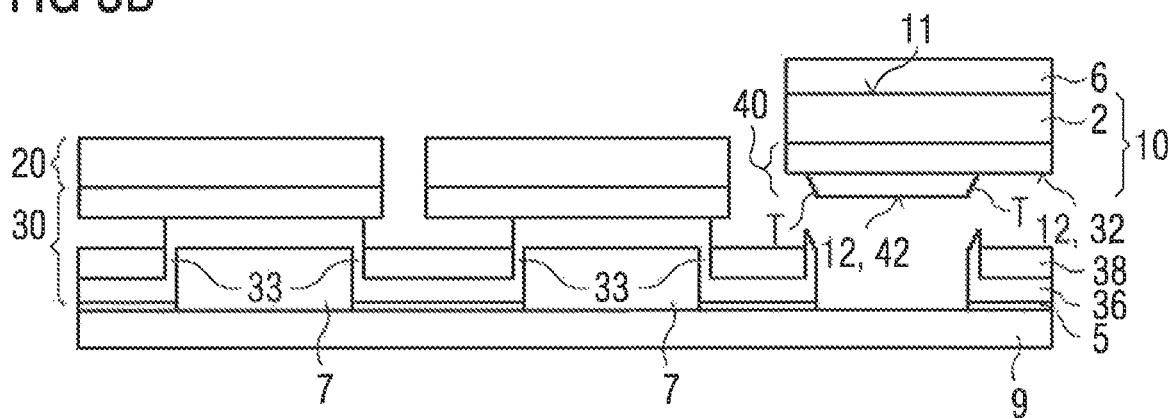

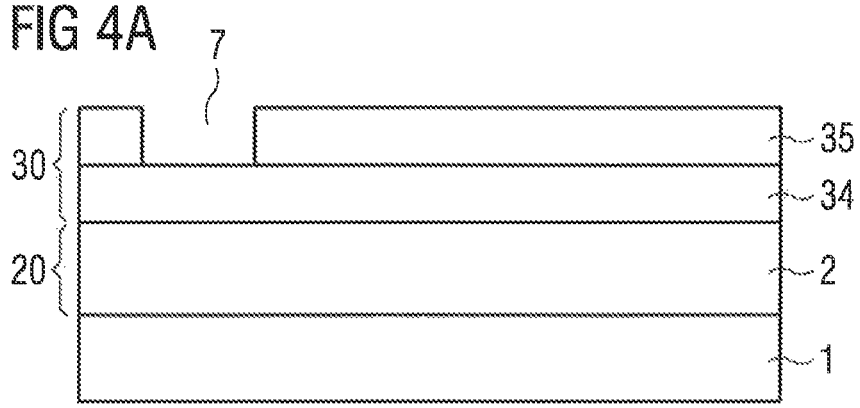
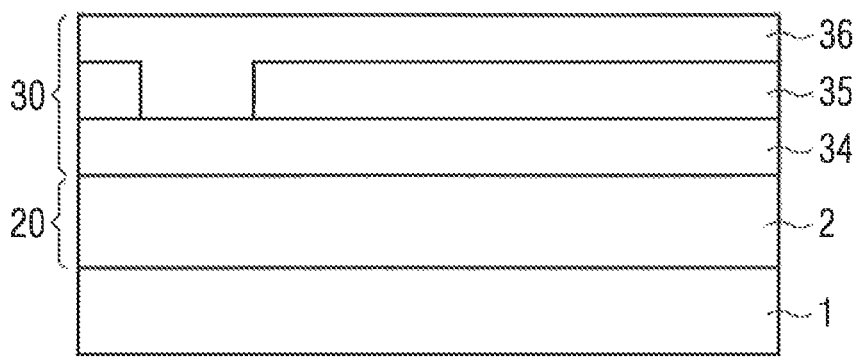
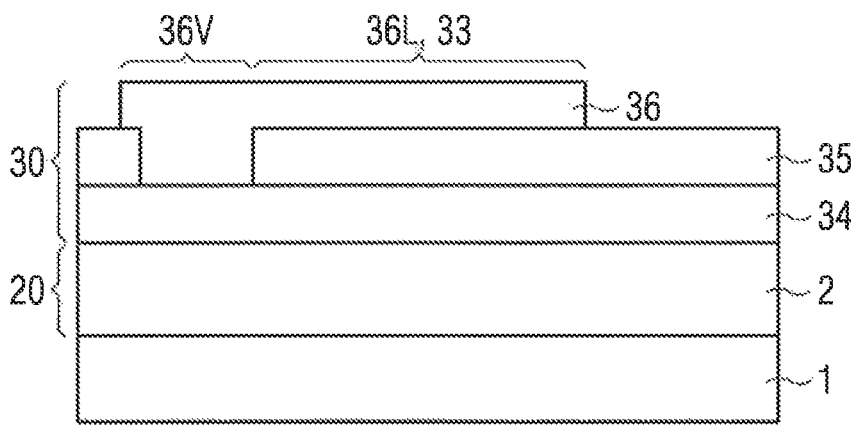

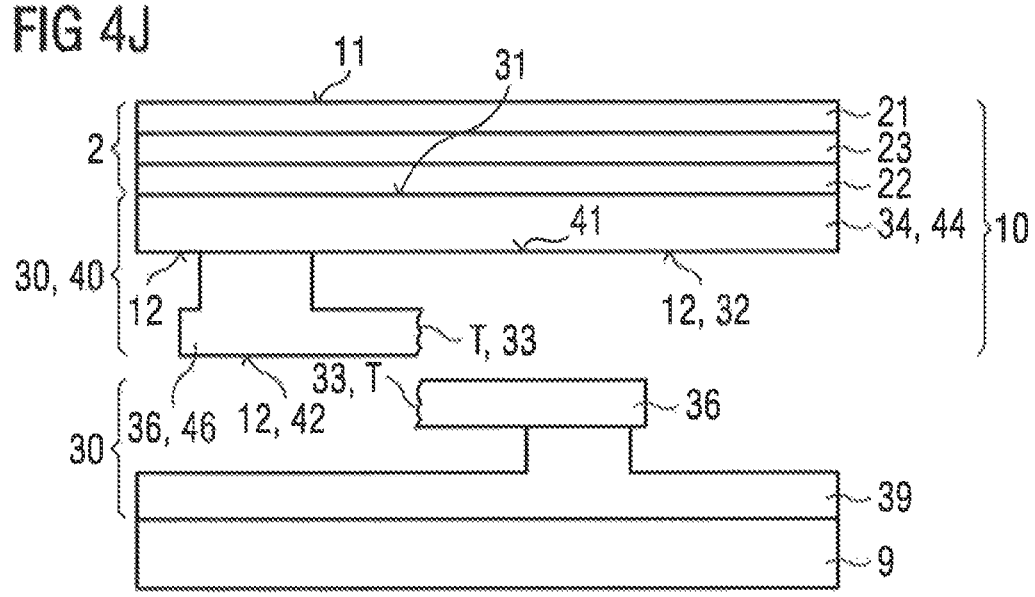
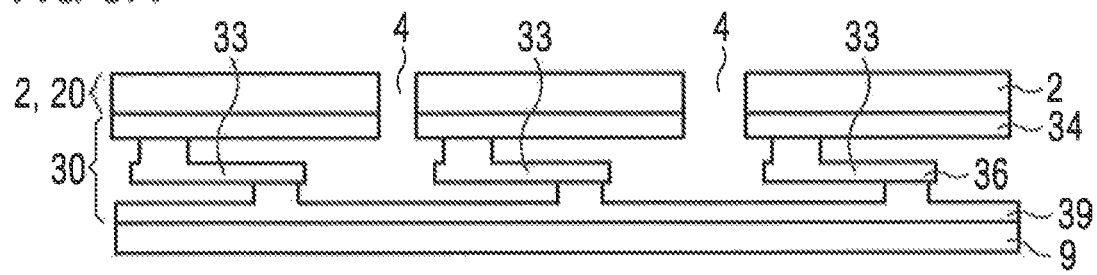
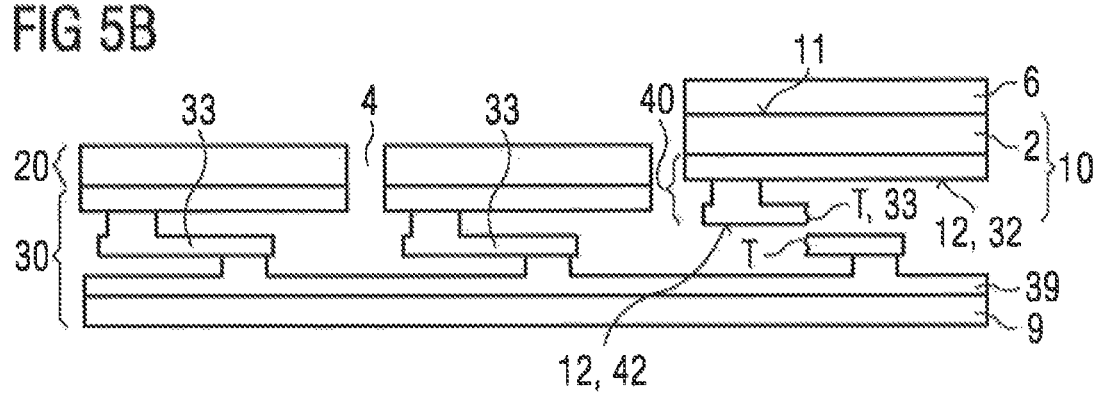

METHOD OF SEPARATING A COMPONENT USING PREDETERMINED BREAKING POSITION AND A COMPONENT OBATINED BY SUCH METHOD

This patent application is a national phase filing under section 371 of PCT/EP2018/057013, filed Mar. 20, 2018, which claims the priority of German patent application 102017106730.2, filed Mar. 29, 2017, each of which is incorporated herein by reference in its entirety.

TECHNICAL FIELD

A method for producing a component or a plurality of components for electronic devices is specified. Furthermore, a component for an electronic device is specified.

BACKGROUND

When transferring components, in particular thin-film semiconductor bodies, preferably, structures are required with which the components can be held stable on a carrier before they can be removed safely and in a targeted manner from the carrier using for instance an adhesive stamp. For this purpose, lateral anchor structures can be formed next to the components. However, these require a comparatively larger surface if the components become smaller, because the lateral anchor structures have to be led out on the side of the components. Alternatively, the anchor structures can be formed in the form of delamination layers between the components and the carrier, wherein the components are detached from the carrier due to delamination at a boundary layer between different materials when the components are removed. This is, however, often unreliable.

According to at least one embodiment of a method for producing a plurality of components, in particular for electronic devices, a composite of components is arranged on a carrier. The composite of components can be divided into a plurality of components. In particular, an anchoring layer is arranged between the components and the carrier. The anchoring layer preferably comprises one predetermined breaking layer or several predetermined breaking layers, wherein predetermined breaking positions are provided or formed in the predetermined breaking layer or in the predetermined breaking layers. Preferably, the predetermined breaking layers are formed to be mechanically breakable. In a plan view of the carrier, the component can cover its associated predetermined breaking layer or the predetermined breaking positions, in particular completely. For example, in a plan view, the components completely cover one of the predetermined breaking layers, wherein the predetermined breaking layers are spatially spaced from each other in lateral directions. When a component is removed, only a predetermined breaking layer belonging to the component or a plurality of the predetermined breaking positions belonging to the component is/are broken, for instance mechanically, so that the component can be removed from the carrier in a selective manner.

A lateral direction is understood to mean a direction running along, in particular parallel to a main extension surface of the component or of the carrier. A vertical direction is understood to mean a direction directed transversely or perpendicularly to the main extension surface. The vertical direction and the lateral direction are thus transverse or essentially perpendicular to each other.

SUMMARY OF THE INVENTION

According to an embodiment, in at least one method for producing a plurality of components, in particular for electronic devices, a substrate is provided. A composite of components is applied onto the substrate. An anchoring layer is formed on the composite of components. A carrier is attached to the anchoring layer, wherein the anchoring layer is located between the substrate and the carrier. The substrate can be removed from the carrier or from the composite of components. Before removing or after removing the substrate, the composite of components can be divided into a plurality of components by forming a plurality of separating trenches. In particular, after removing the substrate, the components continue to be held on the carrier by the anchoring layer. Due to the anchoring layer, the components are arranged on the carrier preferably in an ordered manner, for instance even after the substrate has been removed. The anchoring layer has at least one predetermined breaking layer comprising at least one predetermined breaking position, wherein the predetermined breaking position is laterally surrounded by the separating trenches and covered by one of the components in a plan view of the carrier.

The predetermined breaking layer can have a plurality of such predetermined breaking positions. The anchoring layer may also have a plurality of predetermined breaking layers, each of which is laterally surrounded by the separating trenches. The predetermined breaking layer or the plurality of predetermined breaking layers is/are arranged between the carrier and the components. Preferably, in a plan view of the carrier, the predetermined breaking layers are each completely covered by one of the components. For example, a single or a plurality of predetermined breaking layers is/are assigned to each component. It is also possible that a single component or a plurality of components is/are assigned to each predetermined breaking layer.

The anchoring layer keeps the components ordered and labile or just sufficiently stable on the carrier before they are removed from the carrier individually or in groups for further processing steps in a targeted and safe manner. Since the predetermined breaking layers are located below the components and are partially or completely surrounded in particular by the separating trenches between adjacent components, the separating trenches are free of predetermined breaking positions or free of predetermined breaking layers and can therefore be particularly narrow. This means that no material of the composite of components is unnecessarily removed in the regions of the separating trenches for the purpose of singulating the components.

According to at least one embodiment of the method, the anchoring layer is multi-layered. The anchoring layer has a first sublayer facing the composite of components and a second sublayer facing away from the composite of components, wherein the second sublayer forms the predetermined breaking layer or the plurality of predetermined breaking layers. In particular, the second sublayer is formed in such a way that predetermined breaking positions are provided or formed in the predetermined breaking layer or in the predetermined breaking layers. For example, a predetermined breaking position or a plurality of predetermined breaking positions in the respective predetermined breaking layer is/are formed by the design of the geometry of the respective predetermined breaking layers only. In particular, the predetermined breaking layer is formed in such a way that the predetermined breaking layer breaks or is torn when the associated component is removed at the predetermined breaking position or at the predetermined breaking positions. In this sense, the predetermined breaking layer is mechanically breakable.

In particular, the predetermined breaking layer is formed in such a way that a mechanical breakage can be achieved within one layer of the same material. The predetermined breaking position is not located at an interface between two layers of different materials. For example, the separation traces occurred due to the breakage show the same material on both sides of the separated predetermined breaking layer.

The predetermined breaking positions in the predetermined breaking layer or in the predetermined breaking layers can thus be adjusted in a targeted manner via geometric factors, in particular via the local layer thicknesses or step heights of the predetermined breaking layer or of the predetermined breaking layers. The design of such predetermined breaking layers comprising local predetermined breaking positions can be adjusted much more precisely and reliably than the adhesion properties of delamination layers at the interfaces. The breaking load and thus the reproducibility of the removal of the component or of the components are therefore independent on process fluctuations or adhesion at the interfaces. The reliability of the removal process is thus particularly increased.

According to at least one embodiment of the method, the first sublayer is applied onto the composite of components. A sacrificial layer is formed on the first sublayer. The second sublayer or the predetermined breaking layer is applied to the sacrificial layer, wherein the sacrificial layer is structured in such a way that the predetermined breaking layer extends regionally throughout the structured sacrificial layer, in particular up to the first sublayer. The structured sacrificial layer serves in particular to form the predetermined breaking layer having a given geometry so that the predetermined breaking layer has one or more predetermined breaking positions due to the given geometry.

The sacrificial layer can be applied in a structured manner or it can first be applied onto the first sublayer as a flat layer and then be structured in a subsequent method step in such a way that the sacrificial layer has one or several openings. In order to facilitate the formation of a mechanical breakage at the predetermined breaking positions, the sacrificial layer can be removed, in particular selectively, in a subsequent method step. In particular, the structured sacrificial layer is formed so that the predetermined breaking layer takes a predetermined geometry, at least locally, for example, in the form of a step or of a lever arm with at least one fixed point.

According to at least one embodiment of the method, separating trenches are formed throughout the first sublayer of the anchoring layer. Along the vertical direction, the separating trenches can extend throughout the composite of components, separating the composite of components into a plurality of components. In particular, the sacrificial layer is at least partially exposed in the separating trenches. The sacrificial layer can thus be made accessible from the outside in the region of the separating trenches. The sacrificial layer can be selectively removed by adding an etchant. It is also possible that the separating trenches are formed in such a way that they extend completely throughout the anchoring layer for instance as far as the carrier.

According to at least one embodiment of the method, the predetermined breaking layer is formed in such a way that it has a vertically extending region and a laterally extending region. In particular, the vertically extending region and the laterally extending region form a bend, for example, in the form of a step, of the predetermined breaking layer. At least one predetermined breaking position is provided in the vertical region of the predetermined breaking layer. For example, the predetermined breaking layer at the predetermined breaking position has a reduced lateral or vertical layer thickness in comparison with its adjacent regions. In particular, the vertically extending region and the laterally extending region of the predetermined breaking layer form a step, wherein the at least one predetermined breaking position is formed in the vicinity, for instance in the direct vicinity, of a corner of the step. Several predetermined breaking positions can be formed in the predetermined breaking layer. In particular, the predetermined breaking positions form a closed or an open frame which encloses the laterally extending region of the predetermined breaking layer.

Alternatively or in addition, at least one predetermined breaking position can be provided or formed in the laterally extending region of the predetermined breaking layer. For example, the vertically extending region has an increased local layer thickness compared to the laterally extending region, wherein the laterally extending region serves as a lever arm and the vertically extending region as its fixed point, so that the laterally extending region of the predetermined breaking layer is formed to be breakable, in particular mechanically breakable, when a lever force is applied. The predetermined breaking layer can have several such fixed points, for example, two such fixed points, wherein the laterally extending region of the predetermined breaking layer extends between the fixed points. When the component is removed, the predetermined breaking layer is pulled up along the vertical direction, wherein the laterally extending region continues to be held by the vertically extending region formed as a fixed point. If a sufficiently high lever force is applied, the lateral region of the predetermined breaking layer can be torn apart, i.e., mechanically broken.

According to at least one embodiment of the method, the components are selectively removed from the carrier by local mechanical breaking of the predetermined breaking layer at the predetermined breaking positions. A stamp adhering to the component or components can be used for this purpose.

In at least one embodiment of a component, which in particular can be produced by the method described above, the component has a main body and a carrier layer. In particular, the carrier layer is formed as part of the anchoring layer described here. The carrier layer has a surface which faces away from the main body and shows separation traces of a mechanical breakage. In particular, the surface of the carrier layer having the separation traces is an exposed surface of the component.

The method described above is particularly suitable for producing a component described here. The features described in connection with the component can therefore be used for the method and vice versa.

The component can be a converter platelet. The converter platelet contains an optically active material configured to convert light of a first peak wavelength into light of a second peak wavelength different from the first peak wavelength. The material can contain phosphors, for example, in the form of phosphor particles. The phosphors or phosphor particles can be embedded in a matrix material of the main body. A phosphor is understood to mean an optically active material that is configured to convert radiation in short-wave spectral ranges such as in blue or ultraviolet spectral ranges into radiation in long-wave spectral ranges such as in yellow, green or red spectral ranges. In addition to the phosphors, the main body may contain radiation reflecting or radiation scattering particles.

It is possible that the optically active material is a crystalline material. Such material can be epitaxially grown on the substrate. The crystalline material is especially optically excitable. For example, the crystalline material is optically pumped with pump radiation and can emit electromagnetic radiation whose peak wavelength differs from a peak wavelength of the pump radiation. The main body of the converter platelet is especially free of phosphors in the form of phosphor particles and can consist of the optically active crystalline material.

Alternatively, the component may be an electronic or optoelectronic semiconductor component, wherein the main body of which may have a plurality of semiconductor layers. For example, the main body has a first semiconductor layer, a second semiconductor layer and an intermediate active layer, wherein the active layer is configured in particular for emitting or detecting electromagnetic radiation. The main body may be based on a III-V or II-VI compound semiconductor material. It is possible that the main body can be electrically contacted via the carrier layer. For this purpose, the carrier layer can be formed at least partially from an electrically conductive material. It is possible that the component may have electrical connection layers extending throughout the carrier layer. In this case, the carrier layer may have an electrically insulating layer which in particular completely covers the main body except for the electrical connection positions of the connection layers.

According to at least one embodiment of the component, the carrier layer comprises a first sublayer and a second sublayer, wherein the first sublayer is disposed between the main body and the second sublayer. The second sublayer covers the first sublayer and the main body, in particular only partially. For example, the separation traces are present only on surfaces of the second sublayer.

Partial coverage of the first sublayer by the second sublayer may mean that at most 5%, 10%, 20%, 30%, 40%, 50% or at most 70% of the surface of the first sublayer facing away from the main body are covered by the second sublayer. In this case, the exposed surface of the carrier layer facing away from the main body is partly formed by surfaces of the first sublayer and partly by surfaces of the second sublayer.

According to at least one embodiment of the component, the carrier layer is formed at least partially or completely of a dielectric material or of dielectric materials. For example, the first sublayer completely covers the main body except for possible electrical connection positions. It is possible that the first sublayer may be removed in places to expose the electrical connection positions. The surface of the carrier layer, which shows the separation traces, can be formed as the mounting surface of the component. Alternatively, it is possible that the carrier layer is at least partially or completely metallic. For example, the first sublayer may be electrically insulating and the second electrically conductive, or vice versa. It is also possible that the first sublayer and the second sublayer of the carrier layer are formed from one electrically conductive material or from different electrically conductive materials.

According to at least one embodiment of the component, the main body is a semiconductor body. The carrier layer can be formed at least partially from an electrically conductive material, wherein the main body can be electrically contacted via the carrier layer. For example, the second sublayer is made of a metal, wherein the main body can be electrically contacted via the second sublayer. The first sublayer can be formed from an electrically insulating material. Alternatively, it is possible that both the first and the second sublayer are made of one electrically conductive material or of different electrically conductive materials.

According to at least one embodiment of the component, the carrier layer is formed in such a way that it carries the main body. In other words, the carrier layer forms a carrier of the component. In particular, the carrier layer forms the only carrier of the component. The component can be free of a growth substrate. Preferably, the first sublayer is formed as a mechanically stabilizing layer of the carrier layer. As a mechanically stabilizing layer, the first sublayer is form regarding its material and thickness in such a way that it is a self-supporting layer and mechanically stabilizes the component so that the component does not deform or does not deform significantly under its own weight.

BRIEF DESCRIPTION OF THE DRAWINGS

Further advantages, preferred embodiments and further developments of the component or of the method will become apparent from the exemplary embodiments explained below in conjunction with FIGS. 1 to 5B.

FIGS. 2A, 2B, 2C, 2D, 2E, 2F and 2G show schematic sectional views of further method steps for producing one or a plurality of components as schematically shown for instance in FIG. 2G;

FIGS. 3A and 3B show further illustrations of method steps wherein several components to be produced are schematically shown;

FIGS. 4A, 4B, 4C, 4D, 4E, 4F, 4G, 4H, 4I and 4J show schematic sectional views of some steps of a further method for producing one or a plurality of components schematically shown, for example, in FIG. 4J; and FIGS. 5A and 5B show further illustration of method steps wherein several components to be produced are schematically shown.

DETAILED DESCRIPTION OF ILLUSTRATIVE EMBODIMENTS

Figure 1A:
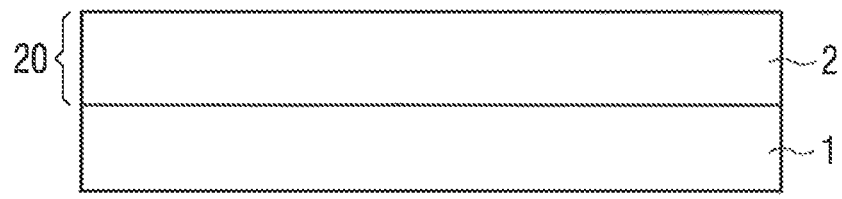
FIGS. 1A, 1B and 1C show schematic sectional views of different method steps of an exemplary embodiment for producing a plurality of components.

A substrate 1 is provided in FIG. 1A. On substrate 1, a composite of components of 20 is arranged. In a subsequent method step, the composite of components 20 can be singulated into a plurality of main bodies 2 of the components 10 to be produced. The main body 2 or the composite of components 20 may be a semiconductor body having a plurality of semiconductor layers. In this case, the substrate 1 can be a growth substrate on which the semiconductor layers are grown epitaxially. The growth substrate 1 may be a wafer substrate such as a sapphire substrate, a silicon substrate or a substrate of another semiconductor material. Alternatively, the composite of components 20 is a composite of converter platelets. In this case, the substrate 1 may be different from a growth substrate.

Figure 1B:
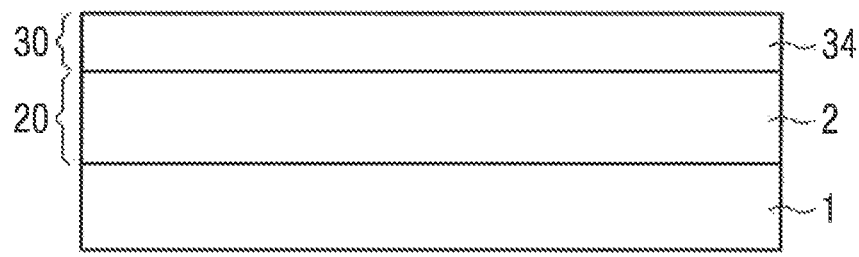

According to FIG. 1B, an anchoring layer 30 is applied onto the composite of components 20. For this purpose, a first sublayer 34 is first formed for instance over the entire surface of the composite of components 20. In particular, the first sublayer 34 serves as an etch stop layer. For example, the first sublayer 34 is made of a dielectric material such as silicon dioxide or a metal such as aluminum, nickel, chromium, platinum, gold or mixtures or alloys thereof. If the composite of components 20 or the main body 2 is a semiconductor body, the first in particular electrically conductive sublayer 34 may be in electrical contact with the semiconductor body 2. It is also possible that the first sublayer 34 is electrically insulating and in particular completely covers the semiconductor body 2 or the composite of components 20 except for possible electrical connection positions.

Figure 1C:
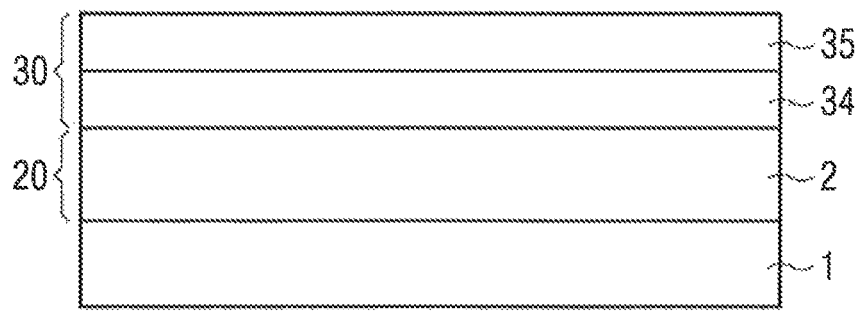

In FIG. 1C, a sacrificial layer 35 is applied onto the first sublayer 34. The sacrificial layer 35 can be formed by a coating process on the first sublayer 34. The first sublayer 34 is preferably formed from a material that is more resistant to etching than a material of sacrificial layer 35. The sacrificial layer 35 can be formed from a material such as germanium or silicon.

According to FIG. 2A, an intermediate layer 38 is applied to the sacrificial layer 35. The intermediate layer 38 and the first sublayer 34 can be made of the same material, for instance of silicon dioxide.

According to FIG. 2B, the intermediate layer 38 is structured to partially expose the sacrificial layer 35. A lithography process, a dry etching process, such as reactive ion etching, in particular with chlorine or fluorine as etching agent, can be used for this purpose. The exposed regions of the sacrificial layer 35 can then be partially removed using a wet chemical etching process. An opening 7 or a plurality of openings 7 is/are formed, wherein the opening 7 extends along the vertical direction throughout the intermediate layer 38 and the sacrificial layer 35, for example, as far as the first sublayer 34. In the region of the opening 7, the intermediate layer 38 protrudes laterally beyond the sacrificial layer 35. The intermediate layer 38 and the sacrificial layer 35 form a step in the region of the opening, wherein in a plan view of the first sublayer 34, the intermediate layer 38 in particular completely covers the sacrificial layer 35. FIG. 2B shows only a section of the anchoring layer 30. The anchoring layer 30 may have a plurality of such openings 7.

According to FIG. 2C, a second sublayer 36 of the anchoring layer 30 is applied onto the composite of components 20. In FIG. 2C, the second sublayer 36 adjoins the first sublayer 34 in the region of opening 7. In particular, the second sublayer 36 adjoins the intermediate layer 38 both inside the opening 7 and outside the opening 7. Due to the lateral protrusion of the intermediate layer 38 over the sacrificial layer 35, the intermediate regions B are formed which are arranged in the lateral direction between the sacrificial layer 35 and the second sublayer 36. Especially in the intermediate regions B, the anchoring layer 30 or the second sublayer 36 has the lowest layer thickness. In other words, the second sublayer 36 has a reduced thickness at the edges of the opening 7 and thus mechanical weak points due to the step formed by the intermediate layer 38 and the sacrificial layer 35 and due to the lateral protrusion of the intermediate layer 38 over the sacrificial layer 35. The mechanical weak points form the predetermined breaking positions 33 of the second sublayer 36.

As a result of the covering, at the edges of the opening, the second sublayer 36 has steps 7 formed by vertically extending regions 36V and laterally extending region 36L of the second sublayer 36. In the region of an opening 7, a laterally extending region 36L and its associated vertically extending regions 36V form a predetermined breaking layer. In this sense, the second sublayer 36 is formed in places as a predetermined breaking layer and can therefore have a corresponding predetermined breaking layer 36 for each opening 7.

Due to the special geometry, internal cracks R, in particular internal nano-cracks or micro-cracks, can be formed around the corner of the step or around the corners of the steps. In this sense, the vertically extending regions 36V (see FIG. 2D) also form mechanical weak points of the second sublayer 36. The second sublayer 36 is thus at least partly formed as a predetermined breaking layer 36 of the anchoring layer 30, wherein the predetermined breaking positions 33 are formed in the vertically extending regions 36V of the predetermined breaking layer 36. The cracks R are caused by the geometry of the predetermined breaking layer 36 at the edges of the opening 7 or of the openings 7. Alternatively or additionally, such cracks R can be formed in other subregions of the predetermined breaking layer 36 in a targeted manner. Within the opening 7, the predetermined breaking layer 36 has a laterally extending region 36L (see FIG. 2E) which is enclosed in a frame-like shape in particular by the vertically extending regions 36V.

According to FIG. 2D, a carrier 9 is attached to the anchoring layer 30, in particular by a connecting layer 5, such as a soldering layer made of NiInSn. The composite of components 20 and the anchoring layer 30 are thus arranged in the vertical direction between the substrate 1 and the carrier 9. In the regions of the openings 7, gaps are formed which are enclosed, in particular completely enclosed by the carrier 9 and by the predetermined breaking layer 36.

According to FIG. 2E, the substrate 1 is removed from the composite of components 20 or from the carrier 9, for example, using a laser lift-off process, a chemical process or a mechanical process.

According to FIG. 2F, the remaining subregions of the sacrificial layer 35 are completely removed. For this purpose, separating trenches 4 can be formed throughout the composite of components 20 and the first sublayer 34, wherein the sacrificial layer 35 is accessible in the separating trenches 4 (see FIG. 3A). The remaining subregions of the sacrificial layer 5 can be removed, in particular completely removed, by a wet chemical process or by an etching process using XeF2 or SF6.

In FIG. 2G, a component 10 is selectively separated from the carrier 9, preferably by locally mechanically breaking the predetermined breaking layer 36, especially at the predetermined breaking positions 33. The predetermined breaking layer 36 is broken at its mechanical weak points and thus shows separation traces T on its surface. The separation traces T, which result from the fact that the predetermined breaking layer 36 is mechanically broken or mechanically torn, are characteristic for the separation process and can be verified at the final component 10.

The component 10 has a main body 2 as part of the composite of components 20 and a carrier layer 40 as part of the anchoring layer 30. The component has a front side 11 and a back side 12, wherein the front side 11 is formed by a surface of the main body 2 and the back side 12 by a surface of the carrier layer 40. The back side 12 thus shows separation traces T which are completely covered by the main body 2 in a plan view. The back side 12 is formed in places by the surface of a first sublayer 34 or 44 and in places by the surface of a second sublayer 36 or 46 of the carrier layer 40.

The first sublayer 44 of the carrier layer 40 is part of the first sublayer 34 of the anchoring layer 30 and has a first surface 31 facing the main body 2 and a second surface 32 facing away from the main body 2. The second sublayer 46 of the carrier layer 40 is part of the second sublayer 36 or of the predetermined breaking layer 36 of the anchoring layer 30 and has a first surface 41 facing the main body 2 and a second surface 42 facing away from the main body 2. The back side 12 is thus formed in places by the second surface 32 of the first sublayer 34 or 44 and in places by side surfaces and the second surface 42 of the second sublayer 46 of the carrier layer 40.

As shown in FIG. 2G, the separation traces T are located exclusively on the surface, in particular exclusively on the lateral surfaces of the second sublayer 46. The first sublayer 44 is thus free of the separation traces T. The first sublayer 44 and the second sublayer 46 may be made of the same material or of different materials.

The component 10 is in particular an electronic or optoelectronic component. The main body 2 may be a semiconductor body having a first semiconductor layer 21, a second semiconductor layer 22 and an active layer 23 located therebetween. The active layer 23 can be configured to emit or detect electromagnetic radiation in the infrared, visible or ultraviolet spectral range. The main body 2 can be electrically contacted externally via the carrier layer 40. For electrically contacting the first semiconductor layer 21 via the carrier layer 40, the main body 2 may have one or a plurality of through-vias (not shown here), wherein the through-vias extend throughout the second semiconductor layer 22 and the active layer 23 to the first semiconductor layer 21.

For example, both the first sublayer 44 and the second sublayer 46 of the carrier layer 40 can be made of an electrically conductive material. Alternatively, it is possible that only one of the sublayers 44 or 46 is electrically conductive, while the other sublayer is electrically insulating. In a plan view, the first sublayer 44 completely covers the main body 2, in particular except for possible electrical connection positions. The second sublayer 46 only partially covers the main body 2 or the first sublayer 44.

Deviating from FIG. 2G, it is also possible that component 10 is a converter platelet. In this case, the main body 2 can comprise phosphors, for example, in the form of phosphor particles, which are embedded in a matrix material of the main body 2. The main body 2 may have light-reflecting scattering particles. It is also possible that the main body 2 of the converter platelet contains or consists of an optically active crystalline material.

The first sublayer 44 is preferably formed as a mechanically stabilizing layer of the carrier layer 40. For example, the first sublayer 44 has an average vertical layer thickness which is at least three times, at least five times, 10 times or at least 20 times the average vertical layer thickness of the second sublayer 46. For example, the second sublayer 46 or the predetermined breaking layer 36 has a vertical layer thickness between 1 μm and 10 μm inclusive, between 1 μm and 5 μm inclusive, or between 1 μm and 3 μm inclusive.

The exemplary embodiment for a method step shown in FIG. 3A essentially corresponds to the exemplary embodiment shown in FIG. 2E. In contrast to this, several main bodies 2 are shown which are spatially separated from each other by a plurality of separating trenches 4. The separating trenches 4 extend along the vertical direction throughout the composite of components 20 and the first sublayer 34. In FIG. 3A, the intermediate layer 38 is exposed in places in the separating trenches 4. Deviating from this, it is also possible that the separating trenches 4 only extend up to the sacrificial layer 35. The sacrificial layer 35 can be removed, in particular completely, by adding an etchant to the separating trenches 4, wherein the first sublayer 34 and the intermediate layer 38 as well as the second sublayer 36 can serve as etch stop layers.

Under each main body 2, the second sublayer 36 is formed step-like, wherein a vertically extending region 36V of each step has a reduced layer thickness in comparison with a laterally extending region 36L of the associated step, as a result of which the predetermined breaking positions 33 are formed in the vertically extending regions 36V of the second sublayer 36 being formed at least in regions as a predetermined breaking layer. As shown in FIGS. 3A and 3B, the second sublayer 36 is formed to be contiguous even after the removal of the sacrificial layer 35. The second sublayer 36 comprises a plurality of subregions, each of which is covered, in particular completely covered, by one of the components 10 to be produced. These subregions form the predetermined breaking layers 36 which are assigned to one of the components 10 in each case. The second sublayer 36 has further subregions which are arranged in the vertical direction between the carrier 9 and the intermediate layer 38 and overlap with the separating trenches 14. These further subregions serve in particular as anchoring structures which hold the components to be produced on the carrier 9 labile or just sufficiently stably before the components are selectively removed from the carrier 9.

The exemplary embodiment for a method step shown in FIG. 3B essentially corresponds to the exemplary embodiment shown in FIG. 2G. In contrast to this, FIG. 3B shows a plurality of components 10 on the common carrier 9, wherein the components 10 can be removed individually or in groups from the carrier 9 with the aid of an adhesive stamp 6.

The exemplary embodiment shown in FIG. 4A essentially corresponds to the exemplary embodiment for a method step shown in FIG. 1C. In contrast, the sacrificial layer 35 is structured and has an opening 7. FIG. 4A shows only a section of the composite of components 20 and of the anchoring layer 30. The sacrificial layer 35 may have a plurality of such openings 7.

In FIG. 4B, the second sublayer 36 is applied onto the sacrificial layer 35, wherein the second sublayer 36 fills the opening 7 or the plurality of openings 7. In a plan view of the sacrificial layer, the second sublayer 36 can first cover the entire sacrificial layer. In contrast to the exemplary embodiment shown in FIG. 2C, wherein the second sublayer 36 is formed step-like in places and has both a step-shaped surface facing the first sublayer 34 and a step-shaped surface facing away from the first sublayer 34, the second sublayer 36 shown in FIG. 4B has a surface which faces away from the first sublayer 34 and is flat or substantially flat.

According to FIG. 4C, the second sublayer 36 is structured to form a plurality of predetermined breaking layers 36, for instance using a dry etching process or a wet chemical etching process. The predetermined breaking layer 36 is formed in particular in such a way that it has a vertically extending region 36V and a laterally extending region 36L, wherein at least one predetermined breaking position 33 is provided or formed in the laterally extending region 36L. FIG. 4C shows only a section of the composite of components 20 in the region of a main body 2. In a plan view, the main body 2 of the component 10 to be produced can completely cover the corresponding predetermined breaking layer 36. A plurality of such predetermined breaking layers 36 can be formed which are laterally spaced from each other. In particular, the predetermined breaking layers 36 are each assigned to one of the components 10 to be produced.

Figure 4D:
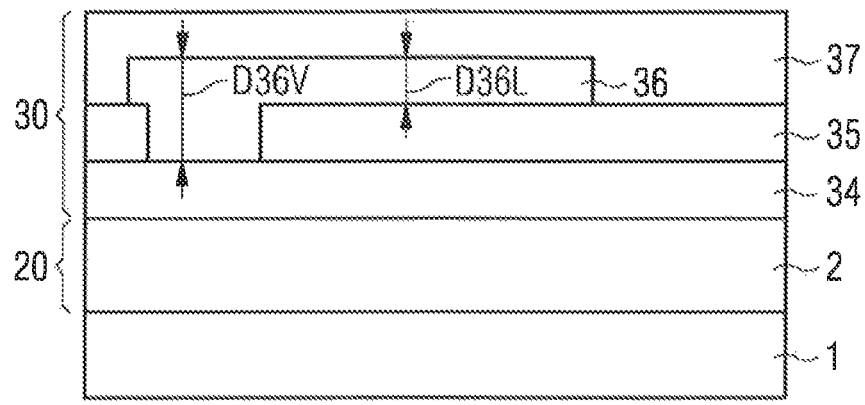

As shown in FIG. 4D, the vertical region 36V has an increased local layer thickness D36V compared to the lateral region 36L. The laterally extending region 36L has a reduced vertical layer thickness D36L, wherein the laterally extending region 36L can serve in particular as a lever arm and the vertically extending region 36V as its fixed point. Preferably, the laterally extending region 36L is formed to be breakable when a lever force is applied. In this sense, at least one predetermined breaking position 33 or several predetermined breaking positions 33 is/are formed in the laterally extending region 36L of the predetermined breaking layer 36.

Figure 4E:
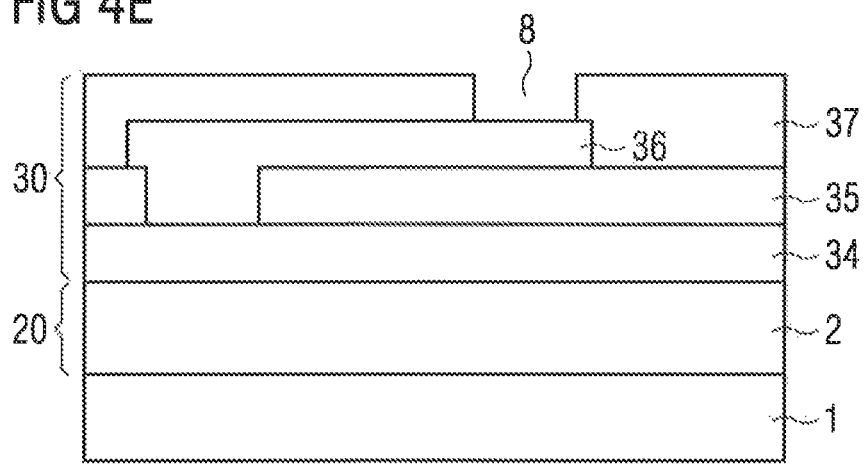

In FIG. 4D, a further sacrificial layer 37 is applied to the predetermined breaking layer 36 and to the sacrificial layer 35. The further sacrificial layer 37 adjoins the sacrificial layer 35 and the predetermined breaking layer 36. The further sacrificial layer 37 is structured according to FIG. 4E and has a further opening 8, as a result of which the predetermined breaking layer 36, in particular the laterally extending region 36L of the predetermined breaking layer 36, is exposed in places. Analogous to the first sacrificial layer 35, the second sacrificial layer 37 can initially be applied to the surface of the composite of components 20 as a flat layer and is subsequently structured. Alternatively, it is also possible that the further sacrificial layer 37 is applied in a structured manner with the help of masks, for example.

Figure 4F:
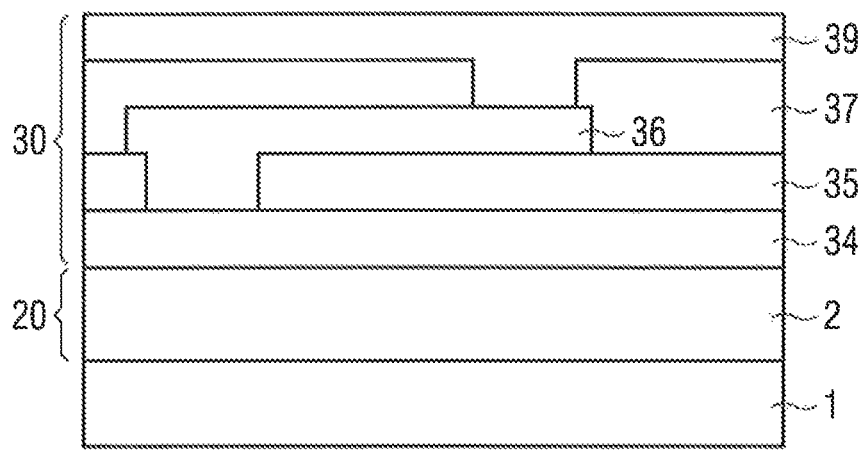

In FIG. 4F, a closing layer 39 of the anchoring layer 30 is formed, wherein the closing layer 39 fills the opening 8 or a plurality of openings 8. In particular, the closing layer 39 in the area of the further opening 8 or of the further openings 8 is adjacent to the laterally extending region 36L of the respective predetermined breaking layers 36. The predetermined breaking layer 36 thus has a laterally extending region 36L which is formed as a lever arm and adjoins two fixed points.

Figure 4G:
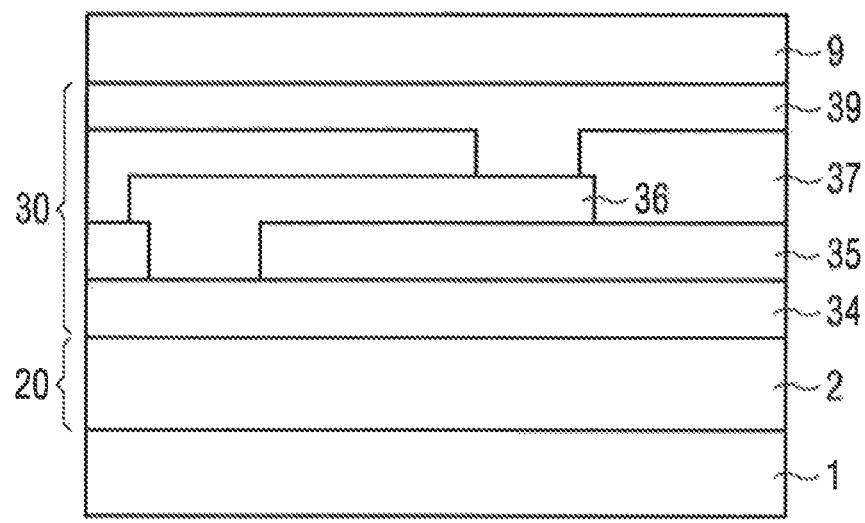
Figure 4H:
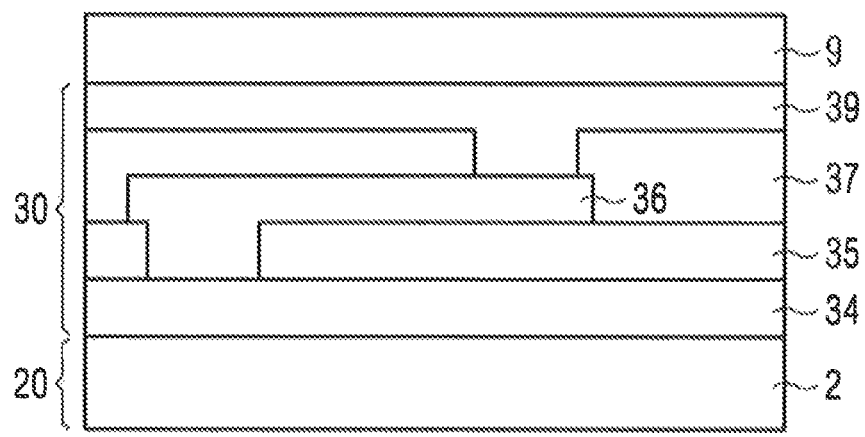
Figure 4I:
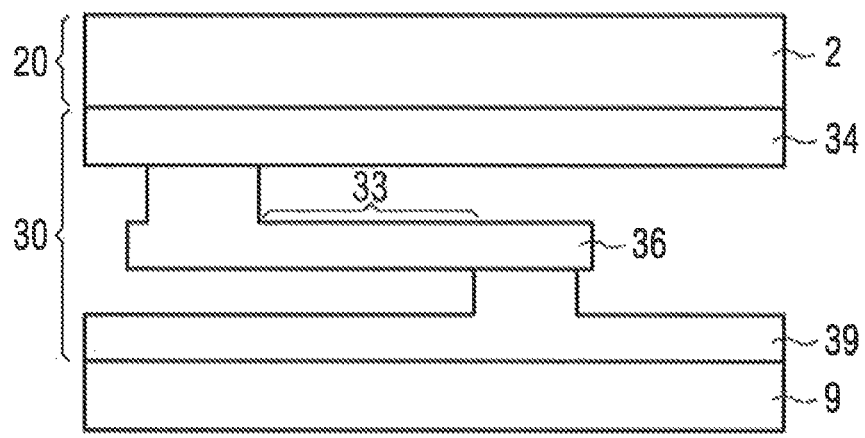

According to FIG. 4G, the composite of components 20 and the anchoring layer 30 are attached to a carrier 9, for example, by means of a connecting layer (not shown here). In a subsequent method step, the substrate 1 is separated from the composite of components 20 (FIG. 4H). The sacrificial layer 35 and the further sacrificial layer 37 can be removed subsequently, in particular completely (FIG. 4I), for instance after the separating trenches 4 have been formed for singulating the composite of components 20 (see FIG. 5A). The components 10 can be separated individually or in groups from the carrier 9 by means of a stamp 6 (FIGS. 4J and 5B).

The method steps shown in FIGS. 4H, 4I, 4J, 5A and 5B are essentially the same as those described in FIGS. 2E, 2F, 2G, 3A and 3B. The characteristics described in connection with FIGS. 2E to 3B can therefore also be used for the method steps shown in connection with FIGS. 4H to 5B, and vice versa. Similarly, the first sublayer 34, the predetermined breaking layer 36 and the closing layer 39 can be formed from an electrically insulating material for instance from SiO2 or from an electrically conductive material such as a metal, for instance from Al, Ni, Cr, Pt or Au, or partly from an electrically conductive and partly from an electrically insulating material.

The carrier layer 40 shown in FIG. 4J has a first sublayer 44 and a second sublayer 46. The sublayers 44 and 46 may each be made from an electrically insulating material or from an electrically conductive material. The second sublayer 46 has a vertical region having an increased vertical layer thickness and a lateral region having a reduced layer thickness and is L-shaped. In particular, the separation traces T are located exclusively on one side surface of the second sublayer 46.

In FIGS. 5A and 5B, the separating trenches 4 extend along the vertical direction throughout the composite of components 20 and the anchoring layer 30 to the closing layer 39. It is possible that the separating trenches 4 are initially formed such that they initially extend only throughout the composite of components 20 and the first sublayer 34 of the anchoring layer 30 to the sacrificial layer 35. By inflowing an etchant, the sacrificial layer 35 and the further sacrificial layer 37 can be removed, in particular completely removed, wherein vertical intermediate spaces are formed between the predetermined breaking layer 36 and the first sublayer 34 as well as between the predetermined breaking layer 36 and the closing layer 39. In particular, the predetermined breaking layer 36 is adjacent both to the first sublayer 34 and to the closing layer 39.

The closing layer 39 serves in particular as an etch stop layer and can also be formed as a contiguous layer after the removal of the sacrificial layers 35 and 37. In particular, the components 10 to be produced will be hold labile or just sufficiently stable on the carrier 9 before the components 10 are selectively removed from the carrier 9, for example, by means of the adhesive stamp 6.

The first sublayer 34 and the second sublayer 36 are each separated into a plurality of laterally spaced subregions of the anchoring layer 30 by the separating trenches 4. The subregions of the anchoring layer 30 are each assigned to one of the components 10 to be produced, wherein each subregion of the anchoring layer 30 is covered, in particular completely covered by one of the components 10 to be produced.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A method for producing a plurality of components for electronic devices, the method comprising:
   providing a substrate;
   applying a composite of components to the substrate;
   forming an anchoring layer on the composite of components;
   attaching a carrier to the anchoring layer, wherein the anchoring layer is disposed between the substrate and the carrier; and
   removing the substrate,
   wherein the composite of components is divided into a plurality of components by forming a plurality of separating trenches,
   wherein, after removing the substrate, the components continue to be held on the carrier by the anchoring layer, and
   wherein the anchoring layer comprises at least one predetermined breaking layer having at least one predetermined breaking position, the predetermined breaking position being laterally surrounded by the separating trenches and—in a plan view of the carrier being covered by one of the components.

2. The method according to claim 1, wherein the anchoring layer is a multi-layer and comprises a first sublayer facing the composite of components and the predetermined breaking layer facing away from the composite of components, and wherein predetermined breaking positions are provided in the predetermined breaking layer.

3. The method according to claim 2,
   wherein the first sublayer is applied onto the composite of components,
   wherein a sacrificial layer is formed on the first sublayer,
   wherein the predetermined breaking layer is applied onto the sacrificial layer, wherein the sacrificial layer is structured in such a way that the predetermined breaking layer extends regionally throughout the structured sacrificial layer to the first sublayer, and wherein the sacrificial layer is removed to facilitate formation of a mechanical breakage at the predetermined breaking positions.

4. The method according to claim 2, wherein the separating trenches are produced throughout the first sublayer of the anchoring layer.

5. The method according to claim 1, wherein the predetermined breaking layer is formed in such a way that it has a vertically extending region and a laterally extending region, and wherein at least one predetermined breaking position is provided in the vertically extending region.

6. The method according to claim 5, wherein the vertically extending region and the laterally extending region form a step, and wherein the at least one predetermined breaking position is formed in a vicinity of a corner of the step.

7. The method according to claim 1, wherein the predetermined breaking layer is formed in such a way that it has a vertically extending region and a laterally extending region, and wherein at least one predetermined breaking position is provided in the laterally extending region.

8. The method according to claim 7, wherein the vertically extending region has an increased local layer thickness in comparison with the laterally extending region, and wherein the laterally extending region serves as a lever arm and the vertically extending region serves as its fixed point so that the laterally extending region is formed to be breakable when a lever force is applied.

9. The method according to claim 1, wherein the components are selectively removed from the carrier by locally mechanically breaking the predetermined breaking layer at the predetermined breaking positions.

10. The method according to claim 1, wherein the predetermined breaking layer is formed in such a way that it has a vertically extending region and a laterally extending region, and wherein the vertically extending region and the laterally extending region form a bend of the predetermined breaking layer.

11. The method according to claim 10, wherein the at least one predetermined breaking position is provided in the vertically extending region, and wherein the vertically extending region and the laterally extending region form a step and the at least one predetermined breaking position is formed in a vicinity of a corner of the step.

12. The method according to claim 10, wherein the at least one predetermined breaking position is provided in the laterally extending region, wherein the vertically extending region has an increased local layer thickness in comparison with the laterally extending region, and wherein the laterally extending region serves as a lever arm and the vertically extending region as its fixed point so that the laterally extending region is formed to be breakable when a lever force is applied.

13. A method for producing a plurality of components for electronic devices, the method comprising:
providing a substrate;
applying a composite of components to the substrate;
forming an anchoring layer on the composite of components;
attaching a carrier to the anchoring layer, wherein the anchoring layer is disposed between the substrate and the carrier; and
removing the substrate,
wherein the composite of components is divided into a plurality of components by forming a plurality of separating trenches,
wherein, after removing the substrate, the components are continued to be held on the carrier by the anchoring layer,
wherein the anchoring layer comprises at least one predetermined breaking layer having at least one predetermined breaking position, wherein the predetermined breaking position is laterally surrounded by the separating trenches and—in a plan view of the carrier is covered by one of the components, and
wherein the predetermined breaking layer is formed in such a way that it has a vertically extending region and a laterally extending region, the vertically extending region and the laterally extending region forming a bend of the predetermined breaking layer.

14. A component for an electronic device comprising:
a main body; and
a carrier layer,
wherein a surface of the carrier layer facing away from the main body has separation traces of a mechanical breakage,
wherein the carrier layer comprises a sublayer of an anchoring layer, and
wherein the separation traces are located exclusively on one side face or on the side faces of the sublayer and—in a plan view—is/are completely covered by the main body.

15. The component according to claim 14, further comprising a converter platelet comprising an optically active material configured to convert light of a first peak wavelength into light of a second peak wavelength different from the first peak wavelength.

16. The component according to claim 14, wherein the component is an electronic or optoelectronic semiconductor component, and wherein the main body comprises a plurality of semiconductor layers.

17. The component according to claim 14,
wherein the carrier layer comprises the sublayer and a further sublayer,
wherein the further sublayer is disposed between the main body and the sublayer, and
wherein the sublayer only partially covers the further sublayer and the main body.

18. The component according to claim 17,
wherein the carrier layer is formed from a dielectric material or from dielectric materials, wherein the further sublayer completely covers the main body with an exception of possible electrical connection positions, and
wherein the surface comprising the separation traces is formed as a mounting surface of the component.

19. The component according to claim 17,
wherein the main body is a semiconductor body,
wherein the carrier layer is formed at least partially from an electrically conductive material, and
wherein the main body is electrically contactable via the carrier layer.

20. The component according to claim 17, wherein the carrier layer carries the main body and the further sublayer is formed as a mechanically stabilizing layer of the carrier layer.

* * * * *